(12) United States Patent
Roychowdhury et al.

(10) Patent No.: US 9,698,781 B1
(45) Date of Patent: Jul. 4, 2017

(54) DYNAMIC CLOCK GATING FREQUENCY SCALING

(71) Applicant: INTEL CORPORATION, Santa Clara, CA (US)

(72) Inventors: Arojit Roychowdhury, Bangalore (IN); Ajaya Durg, Austin, TX (US); Shilpa Huddar, Bangalore (IN); Sunil Shanbhag, Bangalore (IN); Vishram Sarurkar, Folsom, CA (US); Tejpal Singh, Hudson, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/165,501

(22) Filed: May 26, 2016

(51) Int. Cl.
  *H03K 19/00* (2006.01)
(52) U.S. Cl.
  CPC ................ *H03K 19/0016* (2013.01)
(58) Field of Classification Search
  CPC ......... H03K 5/0006; H03K 23/58; G06F 1/10
  USPC .......................................................... 326/93
  See application file for complete search history.

(56) References Cited

U.S. PATENT DOCUMENTS

| | | | |
|---|---|---|---|
| 8,286,014 B2 | 10/2012 | Han et al. | |
| 8,560,863 B2 | 10/2013 | Munguia | |
| 2005/0010683 A1 | 1/2005 | Moleyar et al. | |
| 2005/0071395 A1 | 3/2005 | Prasad et al. | |
| 2005/0289253 A1 | 12/2005 | Edirisooriya et al. | |
| 2009/0195280 A1* | 8/2009 | Schlegel | G11C 7/18 327/162 |
| 2013/0086296 A1 | 4/2013 | Lakshmanamurthy et al. | |
| 2013/0157646 A1 | 6/2013 | Ferren et al. | |
| 2013/0176060 A1* | 7/2013 | Modaran | H03K 25/00 327/115 |
| 2014/0009195 A1 | 1/2014 | Osborne et al. | |
| 2014/0281641 A1 | 9/2014 | Herrera Mejia et al. | |
| 2014/0359311 A1 | 12/2014 | Jahagirdar et al. | |
| 2015/0268711 A1 | 9/2015 | Ramani et al. | |
| 2015/0311888 A1* | 10/2015 | Hu | G06F 1/10 327/115 |

* cited by examiner

*Primary Examiner* — Don Le
(74) *Attorney, Agent, or Firm* — KED & Associates LLP

(57) ABSTRACT

An electronic apparatus may be provided that includes a clock device to provide a clock signal, and a clock gate to receive the clock signal, the clock gate to be selectively provided in an enabled state or a disabled state. The electronic apparatus may also include a controller to determine a frequency transition and to control the clock gate to be in the enabled state or the disabled state based on the determined frequency transition.

21 Claims, 5 Drawing Sheets

DYNAMIC CLOCK GATING FREQUENCY SCALING

BACKGROUND

1. Field

Embodiments may relate to controlling a clock gate based on a specific frequency of a clock signal.

2. Background

Clock gating is a technique to reduce power consumption of idle logic. To save power, clock gating may refer to activating a clock at a logic block only when there is work to be performed. However, clock gating may introduce additional timing constraints. For example, it may be difficult to include clock gating into complex logic where timing margins may be extremely tight.

BRIEF DESCRIPTION OF THE DRAWINGS

Arrangements and embodiments may be described in detail with reference to the following drawings in which like reference numerals refer to like elements and wherein.

DETAILED DESCRIPTION

In the following detailed description, like numerals and characters may be used to designate identical, corresponding and/or similar components in differing figure drawings. Further, in the detailed description to follow, example sizes/models/values/ranges may be given although embodiments are not limited to the same. Where specific details are set forth in order to describe example embodiments, it should be apparent to one skilled in the art that embodiments may be practiced without these specific details.

Embodiments may be applicable to an electronic system, and electronic apparatus and/or an electronic device. The electronic system and/or electronic device may be any one of a mobile terminal, a mobile device, a mobile computing platform, a mobile platform, a server, a laptop computer, a tablet, an ultra-mobile personal computer, a mobile Internet device, a smartphone, a personal digital assistant, a display device, a television (TV), etc.

Embodiments may relate to an electronic system and/or electronic device, which may also be referred to as a platform. The platform may include hardware and software. A processor may be a component of the platform.

Figure 1:
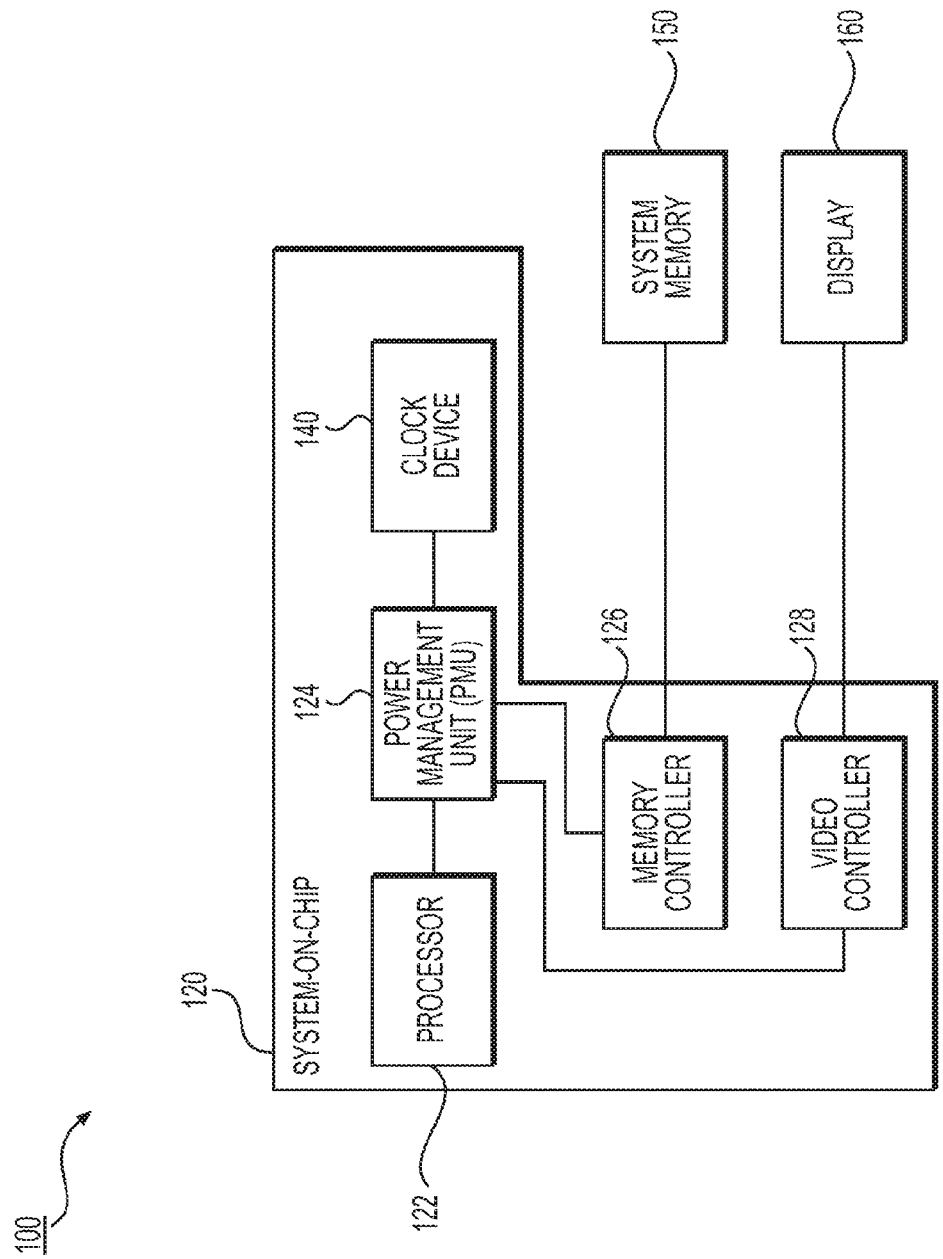
FIG. 1 is a block diagram of an electronic system according to an example arrangement.

FIG. 1 is a block diagram of an electronic system according to an example arrangement. Other configurations and arrangements may also be provided.

More specifically, FIG. 1 shows an electronic system 100 that may include a system-on-chip (SOC) 120, a system memory 150 and a display 160. The components shown in FIG. 1 are merely an example for ease of discussion and description. Other components may also be provided. The electronic system 100 may also be called an electronic apparatus and/or an electronic device.

As one example, the system-on-chip 120 may include a processor 122, a power management unit (PMU) 124, a memory controller 126, a video controller 128 and a clock device 140. These elements are shown merely as an example, and other components may also be provided.

The clock device 140 may provide a clock signal for use by the SOC 120. The clock signal may be used to drive logic at the SOC 120. As one example, the logic may be provided as a functional block (or logic block), and the functional block may be driven by the clock signal. In at least one arrangement, the clock device may include a phase-locked-loop (PLL) circuit to provide the clock signal. The clock signal may be provided at a single frequency. However, the frequency of the clock signal may be changed at the clock device, or may be changed by components of the PMU 124.

The power management unit (PMU) 124 may be coupled to receive the clock signal from the clock device 140. In at least one arrangement, the PMU 124 may manage the clock signal (or clock signal) and provide the clock signal to respective components, such as a the processor 122 (and/or functional block(s) of the processor 122), the memory controller 126 and the video controller 128.

The processor 122 may include logic that may operate based on the received clock signal. In at least one example, the logic (of the processor 122) may include at least one functional block (or logic block). In at least one example, the logic (of the processor 122) may include a plurality of functional blocks. Each functional block may separately receive the clock signal and perform a specific function based on the received clock signal.

The functional block may operate at different frequencies. For example, a functional block (or logic block) may operate in a first mode (that uses a clock signal at a first frequency), and may operate at a second mode (that uses a clock signal at a second frequency). In other words, in order for the functional block to operate at a first mode (or a first operational mode), the clock signal must be provided to the block at the first frequency, and in order for the block to operate at a second mode (or second operational mode), the clock signal must be provided to the block at the second frequency.

The memory controller 126 may be provided on the SOC 120 and may communicate with the system memory 150. The system memory 150 may store information within the system memory 150, and/or information may be provided from the system memory 150 to the SOC 120. The memory controller 126 may receive signals and/or information from the PMU 124.

The video controller 128 may be provided on the SOC 120 and may operate with the display 160 to display images, objects, etc. The display 160 may be external to the SOC 120. The video controller 128 may control the display 160. The video controller 128 may receive signals and/or information from the PMU 124.

Figure 2:
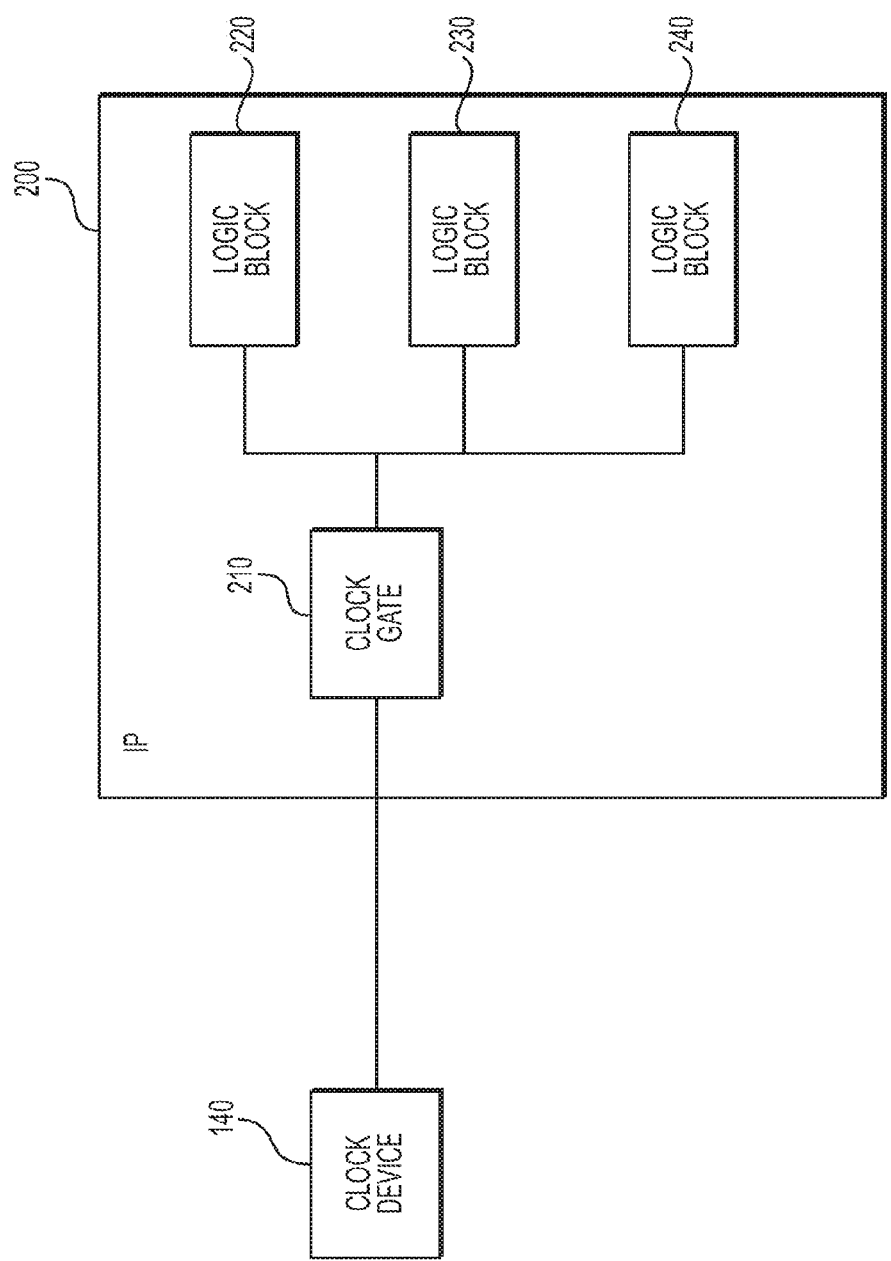
FIG. 2 is a diagram showing a clock source and intellectual property (IP) according to an example embodiment.

FIG. 2 is a diagram showing a clock source and intellectual property (IP) according to an example arrangement. The clock source and IP may be provided in an electronic device, an electronic apparatus or an electronic system. As one example, the clock source and IP may be provided with the electronic system 100 of FIG. 1. Other configurations and arrangements may also be possible.

More specifically, FIG. 2 shows the clock device 140 and intellectual property (IP) 200. The IP 200 may include any of a number of different logic, circuitry, and etc. The IP may refer to a functional module, a processor, a video controller, a memory controller, an interconnect, etc.

In at least one example, the IP 200 may correspond to the processor 122 on the SOC 120. The IP 200 may correspond to other components of an electronic system and/or electronic device/apparatus. In at least one arrangement, the IP 200 may be part of the processor 122 and/or the PMU 124. The IP may include logic. The logic may include circuitry, firmware, functional blocks, etc. in order to perform desired tasks or functions.

Components/elements of the IP 200 may be provided and/or arranged in any of a number of different manners. Thus, while FIG. 2 shows one arrangement, other arrangements and components may also be provided.

As shown in FIG. 2, the IP 200 may include a clock gate 210 and a logic tree. As one example, the logic tree may include logic block 220, logic block 230, and logic block 240. Other numbers of logic blocks may also be provided. The logic blocks may be provided to perform any of a number of different functions, operations and/or applications. Each logic block may include logic and/or circuitry to perform the specific function of the logic block.

As one example, the logic block 220 may be designed to perform a first function (or operation or application) by receiving a clock signal, the logic block 230 may be designed to perform a second function (or operation or application) by receiving a clock signal, and the logic block 240 may be designed to perform a third function (or operation or application) by receiving a clock signal. Each logic block may perform a separate function or application in response to receiving a clock signal.

The clock device 140 may provide a clock signal at a specific frequency. The clock signal may be provided from the clock device 140 to the clock gate 210 of the IP 200. The specific frequency of the clock signal may change and/or be changed.

The clock gate 210 may be provided in two different states, namely: (1) an enabled state, and (2) a disabled state. The enabled state may also be referred to as an enabled mode or closed mode. The disabled state may also be referred to as a disabled mode or opened mode.

If the clock gate 210 is provided in the enabled state, then the clock signal may pass thru the clock gate 210 to each of the respective logic blocks 220, 230, 240 of the logic tree. In other words, the clock signal may be provided to the logic blocks when the clock gate is provided in the enabled state. On the other hand, if the clock gate 210 is provided in the disabled state, then the clock signal may not pass thru the clock gate 210 to each of the respective logic blocks 220, 230, 240 of the logic tree. In other words, the clock signal may be blocked (or denied) from being provided to (or reaching) the logic blocks of the logic tree when the clock gate is in the disabled state.

In at least one example, the clock gate 210 may include a switch that may open or close to provide the clock gate in the enabled state or disabled state, respectively. For example, when the switch (of the clock gate 210) is closed then the clock gate is considered to be provided in an enabled state (or closed state). When the clock gate is in the enabled state, then the clock signal from the clock device 140 may pass thru the clock gate 210 (i.e., thru the switch) and may be provided to each of the respective logic blocks 220, 230, 240 of the logic tree. On the other hand, when the switch (of the clock gate 210) is opened then the clock gate is considered to be provided in a disabled state (or opened state). When the clock gate is in the disabled state, then the clock signal from the clock device 140 may not pass (or be denied) thru the clock gate 210 and the logic blocks may not receive any clock signal. Thus, the logic blocks 220, 230, 240 may not operate when the clock gate 210 is in the disabled state.

Embodiments may implement Dynamic Clock gating Frequency Scaling (DCFS). Embodiments may implement clock gating at an IP (such as a processor, chip, etc.) at only specific frequencies. The specific frequencies may be provided because certain specific frequencies may not meet timing on a clock gating path, and thus the clock gating may be disabled for certain high frequencies. At a lower frequency in which a time period increases, more timing margin may be provided on the clock gating timing path, thereby enabling clock gating at lower frequencies. Embodiments may include determining a specific operating frequency and determining whether a clock gate is to be in an enabled state or a disabled state. For example, a controller may determine a frequency transition, which is a time point in which frequency of the clock signal may change. The controller may control the clock gate to be in the enabled state or the disabled state based on the determined frequency (and/or frequency transition).

In at least one example, during an operation time of the IP, firmware (or software) may selectively enable and/or disable the clock gate based on the respective frequencies of the clock device. This may control whether a clock signal may be provided to at least one of the logic blocks (or functional blocks). Thus, logic blocks may perform specific functions based on specific frequencies. The selective providing of enabling and/or disabling of the clock gate may be performed by a controller, firmware, logic and/or circuitry. The selective providing of enablement or disablement may be based on a specific frequency and/or a frequency transition, such as when a clock signal frequency is to change.

During operation, a bandwidth to be used at an IP (or electronic apparatus) may be determined. In other words, an amount of the bandwidth to be used (or being used) at an IP (or electronic apparatus/system) may be monitored or determined. In order to conserve power, different frequencies may be used based on an amount of data being used. As one example, an application may be executed (or running) and may consume a certain amount of data. The application may operate at any of a plurality of different frequencies. Accordingly, based on the determined bandwidth and the possible frequencies, a determination may be made of a specific frequency (and thus a frequency transition). Based on the frequency (and/or frequency transition), a clock gate at the IP may be selectively enabled or disabled. The enablement and/or disablement of the clock gate (and clock signal) may control whether the clock signal is to be provided to the respective logic blocks. In other words, the logic blocks may receive the clock signal (or not receive the clock signal) based on the selective enablement or disablement of the clock gate. The selective enablement or disablement may be based on a specific frequency (and/or frequency transition).

In at least one embodiment, a controller may operate using firmware (such as p-code) in order to monitor bandwidth, determine frequencies (of the clock signal) and enable/disable the clock gate in order to provide the clock signal (or not provide the clock signal) to the respective logic blocks. The firmware (or p-code) may be stored in a memory, such as a memory of the IP.

In at least one embodiment, a controller may monitor an amount of data being used at an IP (such as a processor, a chip, an SOC, etc.). For example, the controller may monitor data when a specific application (at a logic block) of an IP is being used (or to be used). The controller is therefore able to determine an amount of bandwidth being used (or to be used). Based on the determined amount of bandwidth, the controller may determine at least one of a plurality of different frequencies that may be used. The plurality of different frequencies may be previously stored. As one example, a new determined frequency may be more efficient in terms of power consumption by the IP (or electronic apparatus/system). Based on the new frequency, the controller may control enabling and/or disabling of the clock gate.

More specifically, the controller (by use of firmware and/or software) may determine a specific operating frequency. The specific operating frequency may be based on a frequency of the clock signal from the clock device (which may provide the clock signal at different frequencies) The clock gate may therefore be selectively enabled or disabled based on the determined new frequency.

Embodiments may implement clock gating at specific frequencies based on available timing margin and by adding support in firmware (and/or firmware) to selectively enable/disable clock gating at appropriate frequencies. This may lead to optimal power across workloads operating across different frequency ranges.

As stated above, different clock signals may be provided from the clock device, such as at different frequencies. The different clock signals may be sourced from one/more clock devices (such as different phase locked loops) and/or in the PMU 120.

Figure 3:
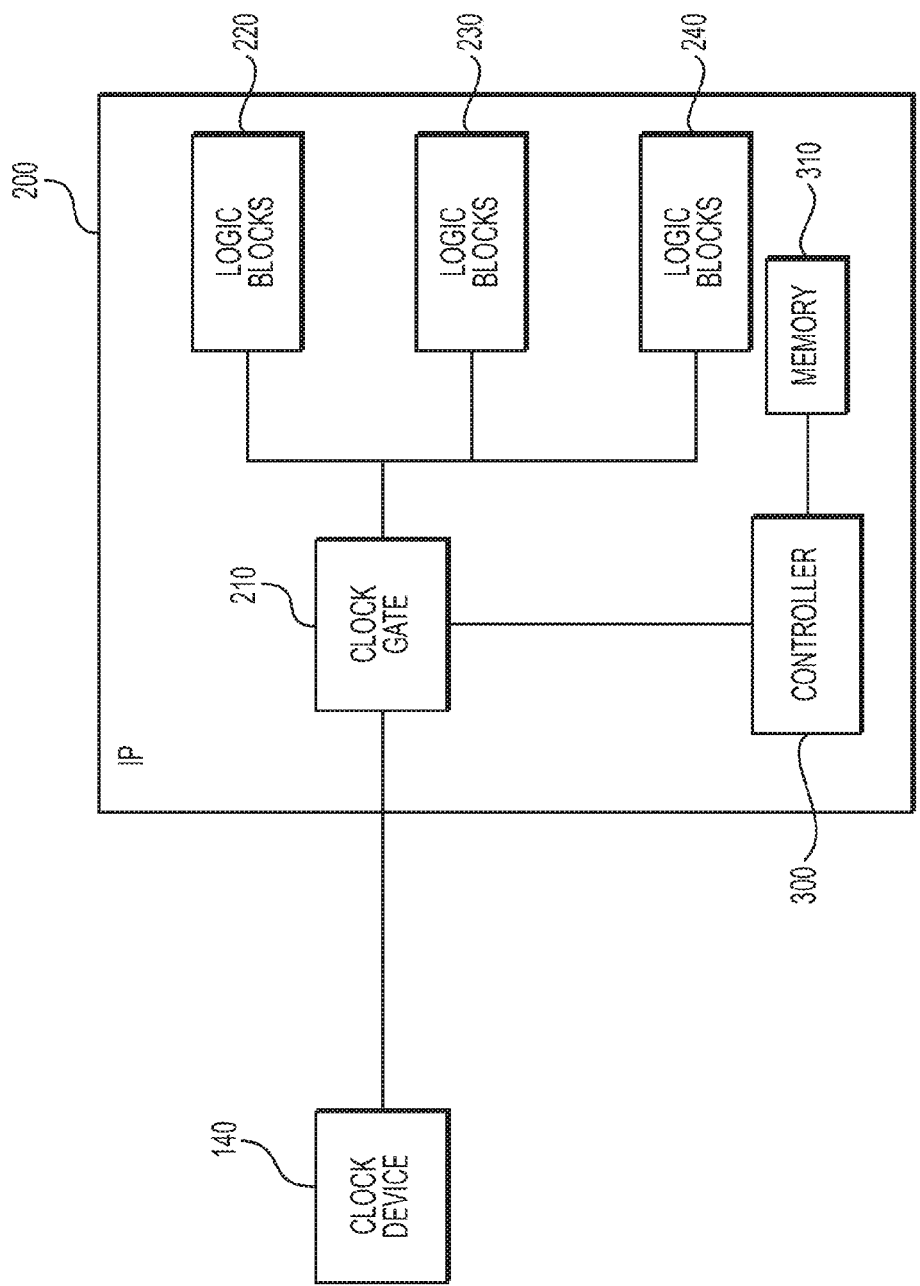
FIG. 3 is a diagram of a clock source and intellectual property (IP) according to an example embodiment.

FIG. 3 is a diagram of a clock source and intellectual property (IP) according to an example embodiment. The clock source and IP may be provided in an electronic apparatus, an electronic device and/or an electronic system. Other configurations and embodiments may also be possible. The diagram of FIG. 3 may include components that are shown in FIG. 2. For ease of discussion, similar or identical components may not be further described.

More specifically, FIG. 3 shows the clock device 140 and the IP 200. The IP 200 may be a platform or a SOC, for example. FIG. 3 also shows a controller 300 (or control device) that may operate based on firmware (such as p-code). The firmware (such as p-code) may be provided in a memory 310, for example. The memory 310 may also be logic for providing memory bandwidth. The controller 300 may selectively control the enablement or disablement of the clock gate 210. In at least one embodiment, a plurality of clock gates may be provided, and each gate may be separately selectively controlled by the controller 300 or other device (such as a processor).

The clock gate 210 may be controlled by a register setting that is statically configured during boot. This may be done to control hardware (HW) settings. The register may be a set of flip-flops to preset the values during boot.

The controller 300 may control the state (enable or disable) of the clock gate 210 based on firmware (such as p-code). The controller 300 may enable/disable clock gating based on the IP frequency and/or frequency of the clock signal (to operate components of the IP). As one example, a memory (or storage) may include information relating to IP frequency (or clock signal frequency) and enablement/disablement of clock gating. This information may hereafter be referred to as information in TABLE 1. A look-up table (shown below) may include this information of TABLE 1 relating to IP frequency and clock gating enablement/disablement. This information may be previously determined and stored at an electronic apparatus, device or system. As one example, the information of the look-up table may be pre-stored into the p-code. The p-code may be software (SW) code that is executed by a controller (or other device).

The information of TABLE 1 may be stored in the memory 310 and/or other memory of the SOC.

TABLE 1

| IP frequency (Ghz) | Clock Gating Enabled |
|---|---|
| 2.1 | NO |
| 1.6 | NO |
| 1.35 | YES |
| 1.1 | YES |

The information of TABLE 1 (shown above) shows that the clock gate 210 may be controlled based on the IP frequency, which is the specific frequency that is to be used to operate the logic blocks of the IP. The frequency may be determined based on the determined bandwidth being used (or to be used). As discussed above, the determination may be performed by any one of the following, namely the controller 300, firmware, p-code, etc.

Embodiments may provide that the clock gate controls whether a clock signal (at a specific frequency) is to be provided to logic (or logic blocks) of the IP. This determination may be based on previously obtained information such as shown in TABLE 1. The information of TABLE 1 may be based on the timing margin available at each frequency for the particular IP.

As shown in TABLE 1, the clock gate 210 may be selectively provided in an enabled state only at specific frequencies. For example, the clock gate 210 may be selectively provided in an enabled state (or closed state) when the specific frequency of the clock signal is to be 1.35 GHz or 1.1 GHz. Thus, when the clock signal is provided at 1.35 GHz or 1.1 GHz, then the clock signal may pass thru the clock gate 210 and be provided to the logic blocks.

On the other hand, the clock gate 210 may be selectively provided in a disabled state (or opened state) when the specific frequency of the clock signal is to be 1.6 GHz or 2.1 GHz. Thus, when the clock signal is provided at 1.6 GHz or 2.1 GHz, then the clock signal does not pass thru the clock gate 210, and the respective logic blocks may not operate (because the logic blocks do not receive a clock signal).

Figure 4:
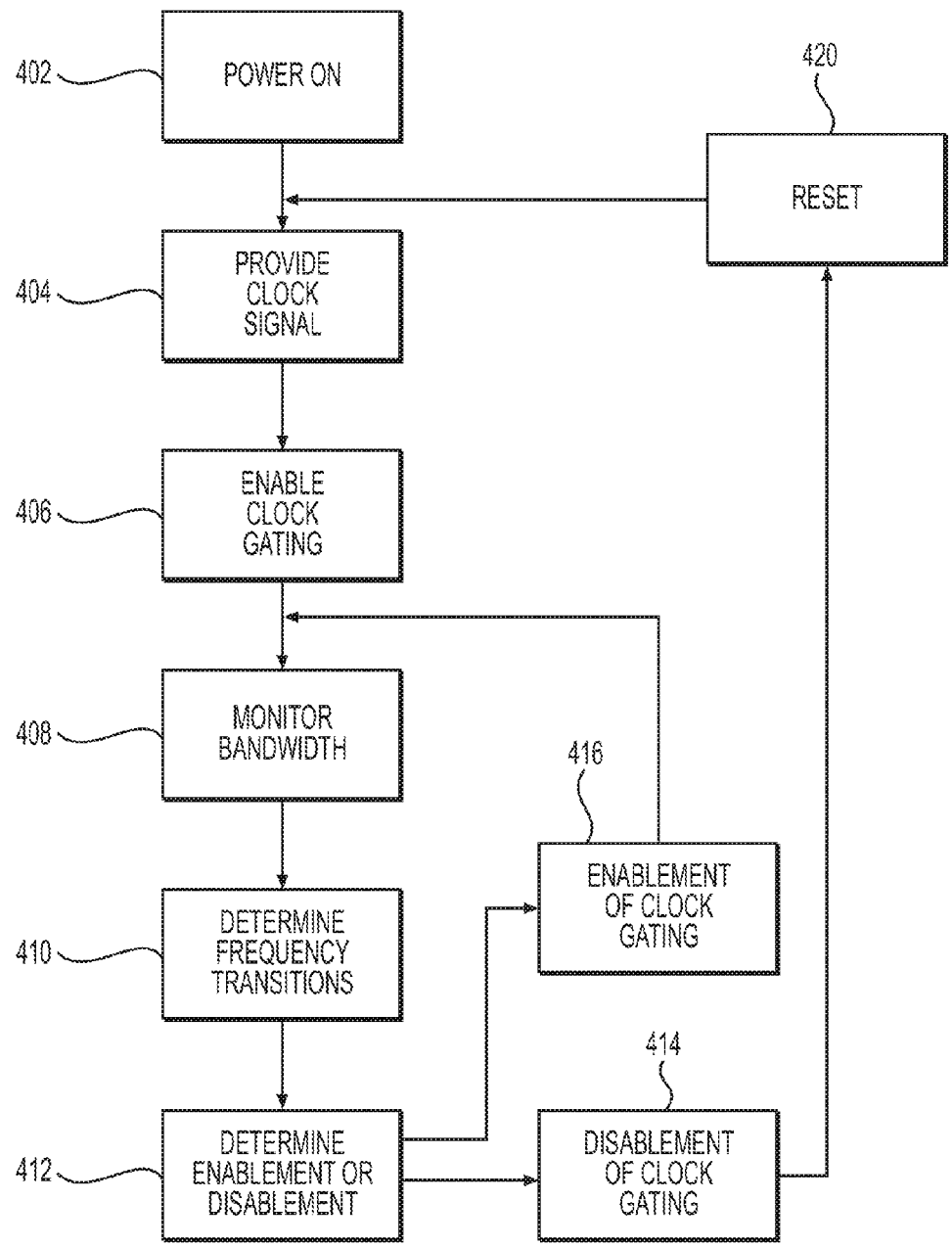
FIG. 4 is a flowchart showing operations according to an example embodiment.

FIG. 4 is a flowchart showing operations according to an example embodiment. Other operations, orders of operations and embodiments may also be used. For ease of discussion, FIG. 4 shows operations relative to an embodiment of an electronic system such as shown in FIG. 3 (which may be components of the electronic system of FIG. 1). FIG. 4 does not show all operations of the electronic system.

The flowchart of FIG. 4 may be performed, at least in part, by a controller, firmware, p-code, etc. This may dynamically control the clock gating of the IP based on the run-time IP frequency.

More specifically, FIG. 4 shows a method of controlling an electronic apparatus, device or system. The electronic apparatus, device or system may be initially powered on in operation 402. In operation 404, a clock signal may be provided (such as from a clock device). The initial clock signal may be a default setting, for example.

In operation 406, clock gating may be selectively enabled (or remain in an enabled state) at a clock gate (such as the clock gate 210). This may allow the clock signal to be provided to the logic blocks of the IP. The clock gating may be enabled initially by default at the initial booting of the electronic system.

In operation 408, a bandwidth may be monitored (or determined) by the controller, for example. The controller may monitor (or determine) the amount of data being used (or to be used) while the electronic apparatus, device or system is operating at the frequency of the clock signal.

Based on the monitoring, the controller (or firmware) may determine that a new frequency may be used for efficiency purposes. In operation 410, the controller may determine a frequency transition (when it is determined that a new frequency is to be used). For example, at a frequency transition point, the firmware (or p-code) may refer to information such as in TABLE 1. This information may be used to determine whether clock gating should be enabled or disabled.

In operation 412, a determination may be made regarding whether to selectively provide the clock gate in an enabled state or in a disabled state. This determination may be made based on the controller, firmware, p-code, etc. For example, based on frequency of the clock signal, a determination may be made whether to enable or disable the clock gate.

Operation 414 involves the disabling of the clock gate. This results in no clock signal being provided to the logic blocks. Thus, the logic blocks will not perform a specific function. For example, if the IP cannot support clock gating at the new determined frequency, then the clock gate may be disabled ("0") in operation 414. Operations may then return to operation 420 where the electronic system (or part of the electronic system) may be restarted. Operation 416 may involve the enabling of the clock gate. This may result in a clock signal (at the specific frequency) to be provided to the logic blocks. Thus, the logic blocks (or functional blocks) will perform the respective specific functions. For example, if the IP can support clock gating at the new determined frequency, then the clock gate may be enabled ("1") in operations 416. Operations may then return to operation 408 where bandwidth may be monitored.

Figure 5:
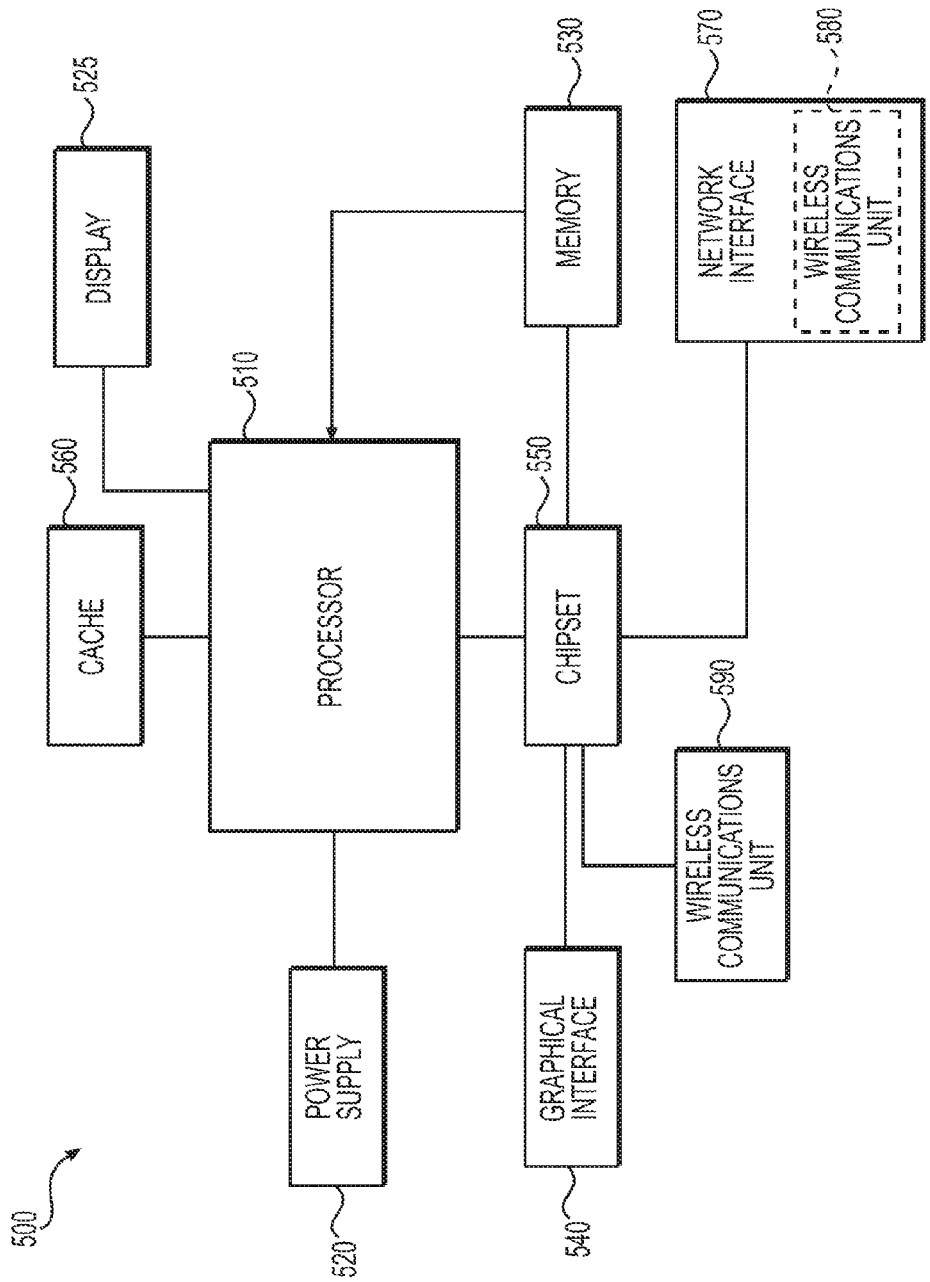
FIG. 5 shows an electronic system according to an example arrangement.

FIG. 5 shows an electronic system according to an example embodiment. Other embodiments and configurations may also be provided. The electronic system is provided to show components of a system that may operate as discussed above.

FIG. 5 shows a system 500 that includes a processor 510, a power supply 520, a display 525 and a memory 530. The processor 510 may include an arithmetic logic unit and an internal cache, for example. The processor 510 may perform operations by using received instructions, such as instructions received via a non-transitory computer-readable medium (or machine-readable medium). The processor 510 may correspond to any previously described processor. A controller may also be provided.

The above-described features may be provided within the electrical system 500 shown in FIG. 5.

The system 500 may also include a graphical interface 540, a chipset 550, a cache 560, a network interface 570 and a wireless communication unit 580, which may be incorporated within the network interface 570. Alternatively or additionally, a wireless communications unit 590 may be coupled to the processor 510, and a direct connection may exist between the memory 530 and the processor 510.

The processor 510 may be a CPU, a microprocessor or any other type of processing or computing circuit and may be included on a chip die with all or any combination of the remaining features, or one or more of the remaining features may be electrically coupled to the microprocessor die through known connections and interfaces. The connections that are shown are merely illustrative as other connections between or among the elements depicted may exist depending, for example, on chip platform, functionality, or application requirements.

In at least one embodiment, the processor 510 may be provided on a chip, such as a system on chip as discussed above. The processor may include and/or may be coupled to components such as a memory controller and a graphics device, etc.

In at least one embodiment, a computer-readable medium (or machine-readable medium) may store a program for controlling a clock gate. The program may be stored in a system memory, which may be internal or external to the processor (or a controller), for example. The program may include instructions or code.

Instructions or code executed by the processor (or by the controller) may be provided to a memory from a machine-readable medium, or an external storage device accessible via a remote connection (e.g. over a network via an antenna and/or network interface) providing access to one or more electronically-accessible media, etc. A machine-readable medium may include any mechanism that provides (i.e., stores and/or transmits) information in a form readable by a machine (e.g., a computer). For example, a machine-readable medium may include random access memory (RAM), read only memory (ROM), magnetic or optical storage medium, flash memory devices, electrical, optical, acoustical or other form of propagated signals (e.g., carrier waves, infrared signals, digital signals), etc. In alternative embodiments, hard-wired circuitry may be used in place of or in combination with the instructions or code, and thus embodiments are not limited to any specific combination of hardware circuitry and software instructions.

The program may include code or instructions to perform any of the operations or functions performed in embodiments previously discussed above.

Features of the above described embodiments may be provided in code segments or instructions to perform tasks. The code segments or tasks may be stored in a processor or controller readable medium (or machine-readable medium) or transmitted by a computing data signal in a carrier wave over a transmission medium or communication link. The processor or controller readable medium, machine readable medium and/or computer readable medium may include any medium that can store or transfer information.

The following examples pertain to further embodiments.

Example 1 is an electronic apparatus comprising: a clock device to provide a clock signal; a clock gate to receive the clock signal, the clock gate to be selectively provided in an enabled state or a disabled state; and a controller to determine a specific frequency of the clock signal, and to control the clock gate to be in the enabled state or the disabled state based on the determined specific frequency.

In Example 2, the subject matter of Example 1 can optionally include a first logic block to receive the clock signal when the clock gate is in the enabled state.

In Example 3, the subject matter of Example 1 and Example 2 can optionally include a second logic block to receive the clock signal when the clock gate is in the enabled state.

In Example 4, the subject matter of Example 1 and Example 2 can optionally include the clock signal is to not be received at the first logic block when the clock gate is in the disabled state.

In Example 5, the subject matter of Example 1 and Example 2 can optionally include the first logic block is to perform a specific function in response to receiving the clock signal.

In Example 6, the subject matter of Example 1 can optionally include the controller to change the state of the clock gate based on a determined new frequency.

In Example 7, the subject matter of Example 1 can optionally include a memory to store information regarding enabling or disabling of the clock gate based on a plurality of different frequencies.

In Example 8, the subject matter of Example 1 can optionally include the controller to determine an amount of bandwidth, and to determine the specific frequency based at least in part on the determined amount of bandwidth.

In Example 9, the subject matter of Example 1 can optionally include the controller to determine a new frequency and to change the state of the clock gate based on the determined new frequency.

Example 10 is an electronic apparatus comprising: clocking means for providing a clock signal; gating means for receiving the clock signal, and the gating means to be selectively provided in an enabled state or a disabled state; and control means for determining a specific frequency of the clock frequency, and the control means for controlling the gating means to be in the enabled state or the disabled state based on the determined specific frequency.

In Example 11, the subject matter of Example 10 can optionally include a first logic block for receiving the clock signal when the gating means is in the enabled state.

In Example 12, the subject matter of Example 10 and Example 11 can optionally include a second logic block for receiving the clock signal when the gating means is in the enabled state.

In Example 13, the subject matter of Example 10 and Example 11 can optionally include the clock signal is to not be received at the first logic block when the gating means is in the disabled state.

In Example 14, the subject matter of Example 10 and Example 11 can optionally include the first logic block is to perform a specific function in response to receiving the clock signal.

In Example 15, the subject matter of Example 10 can optionally include the control means for controlling the state of the gating means based on a determined new frequency.

In Example 16, the subject matter of Example 10 can optionally include storing means for storing information regarding enabling or disabling of the gating means based on a plurality of different frequencies.

In Example 17, the subject matter of Example 10 can optionally include the control means for determining an amount of bandwidth, and for determining the specific frequency based at least in part on the determined amount of bandwidth.

In Example 18, the subject matter of Example 10 can optionally include the control means for determining a new frequency and for changing the state of the clock gate based on the determined new frequency.

Example 19 is a method of controlling an electronic apparatus, comprising: providing a clock signal; determining a specific frequency of the clock signal; controlling a clock gate to be selectively provided in an enabled state or a disabled state based on the determined specific frequency; providing the clock signal to a first logic block when the clock gate is selectively provided in the enabled state; and denying the clock signal from reaching the first logic block when the clock gate is selectively provided in the disabled state.

In Example 20, the subject matter of Example 19 can optionally include receiving, at the first logic block, the clock signal when the clock gate is in the enabled state.

In Example 21, the subject matter of Example 19 and Example 20 can optionally include receiving, at a second logic block, the clock signal when the clock gate is in the enabled state.

In Example 22, the subject matter of Example 19 and Example 20 can optionally include the clock signal is to not be received at the first logic block when the clock gate is in the disabled state.

In Example 23, the subject matter of Example 19 and Example 20 can optionally include performing a specific function in response to the first logic block receiving the clock signal.

In Example 24, the subject matter of Example 19 can optionally include the controlling of the clock gate is based on a determined new frequency.

In Example 25, the subject matter of Example 19 can optionally include storing information regarding enabling or disabling of the clock gate based on a plurality of different frequencies.

In Example 26, the subject matter of Example 19 can optionally include determining an amount of bandwidth, and determining the specific frequency based at least in part on the determined amount of bandwidth.

In Example 27, the subject matter of Example 19 can optionally include determining a new frequency and changing the state of the clock gate based on the determined new frequency.

Example 28 is an electronic system comprising: a memory to store information relating to a plurality of frequencies; a clock device to provide a clock signal; a clock gate to be selectively provided in an enabled state or a disabled state; a controller to determine a specific frequency based on the stored information, and the controller to control the clock gate to be in the enabled state or the disabled state based on the determined specific frequency; and a first logic block to receive the clock signal from the clock gate when the clock gate is provided in the enabled state, and the first logic block to perform a specific function based on the received clock signal.

In Example 29, the subject matter of Example 28 can optionally include a second logic block to receive the clock signal when the clock gate is in the enabled state.

In Example 30, the subject matter of Example 28 can optionally include the clock signal is to not be received at the first logic block when the clock gate is in the disabled state.

In Example 31, the subject matter of Example 28 can optionally include the memory to store information regarding enabling or disabling of the clock gate based on the stored plurality of frequencies.

In Example 32, the subject matter of Example 28 can optionally include the controller to determine an amount of bandwidth, and to determine the specific frequency based at least in part on the determined amount of bandwidth.

In Example 33, the subject matter of Example 28 can optionally include the controller to determine a new frequency and to change the state of the clock gate based on the determined new frequency.

Example 34 is an electronic apparatus comprising: first logic, at least a portion of which is hardware, to determine a specific frequency; and second logic, at least a portion of which is hardware, to control a clock gate to be in an enabled state or a disabled state based on the determined specific frequency.

In Example 35, the subject matter of Example 34 can optionally include a first logic block to receive the clock signal when the clock gate is in the enabled state.

In Example 36, the subject matter of Example 34 and Example 35 can optionally include a second logic block to receive the clock signal when the clock gate is in the enabled state.

In Example 37, the subject matter of Example 34 and Example 35 can optionally include the clock signal is to not be received at the first logic block when the clock gate is in the disabled state.

In Example 38, the subject matter of Example 34 and Example 35 can optionally include the first logic block is to perform a specific function in response to receiving the clock signal.

In Example 39, the subject matter of Example 34 can optionally include a memory to store information regarding enabling or disabling of the clock gate based on a plurality of different frequencies.

In Example 40, the subject matter of Example 34 can optionally include the first logic to determine an amount of bandwidth, and to determine the specific frequency based at least in part on the determined amount of bandwidth.

In Example 41, the subject matter of Example 34 can optionally include the first logic to determine a new frequency and to change the state of the clock gate based on the determined new frequency.

Example 42 is a non-transitory machine-readable medium comprising one or more instructions that when executed cause a controller to perform one or more operations to: determine a specific frequency of a clock signal; and control a clock gate to be in an enabled state or a disabled state based on the determined specific frequency of the clock signal.

In Example 43, the subject matter of Example 42 can optionally include a first logic block is to receive the clock signal when the clock gate is in the enabled state.

In Example 44, the subject matter of Example 42 and Example 43 can optionally include a second logic block is to receive the clock signal when the clock gate is in the enabled state.

In Example 45, the subject matter of Example 42 and Example 43 can optionally include the clock signal is to not be received at the first logic block when the clock gate is in the disabled state.

In Example 46, the subject matter of Example 42 and Example 43 can optionally include the first logic block is to perform a specific function in response to receiving the clock signal.

In Example 47, the subject matter of Example 42 can optionally include the one or more operations to include to determine an amount of bandwidth, and to determine the specific frequency based at least in part on the determined amount of bandwidth.

In Example 48, the subject matter of Example 42 can optionally include the one or more operations to include to determine a new frequency and to change the state of the clock gate based on the determined new frequency.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic apparatus comprising:
a clock device to provide a clock signal;
a clock gate to receive the clock signal, the clock gate to be selectively provided in an enabled state or a disabled state; and
a controller to determine a specific frequency of the clock signal, the controller to control the clock gate to be in the enabled state when the determined specific frequency is a first frequency, and the controller to control the clock gate to be in the disabled state when the determined specific frequency is a second frequency different than the first frequency.

2. The electronic apparatus of claim 1, further comprising:
a first logic block to receive the clock signal when the clock gate is in the enabled state.

3. The electronic apparatus of claim 2, wherein the clock signal is to not be received at the first logic block when the clock gate is in the disabled state.

4. The electronic apparatus of claim 2, wherein the first logic block is to perform a specific function in response to receiving the clock signal.

5. The electronic apparatus of claim 1, wherein the controller to change the state of the clock gate based on a determined new frequency.

6. The electronic apparatus of claim 1, further comprising a memory to store information regarding enabling or disabling of the clock gate based on a plurality of different frequencies.

7. The electronic apparatus of claim 1, wherein the controller to determine an amount of bandwidth, and to determine the specific frequency based at least in part on the determined amount of bandwidth.

8. An electronic apparatus comprising:
first logic, at least a portion of which is hardware, to determine a specific frequency; and
second logic, at least a portion of which is hardware, to control a clock gate to be in an enabled state when the determined specific frequency is a first frequency, and to control a clock gate to be in a disabled state when the determined specific frequency is a second frequency different than the first frequency.

9. The electronic apparatus of claim 8, comprising:
a first logic block to receive the clock signal when the clock gate is in the enabled state.

10. The electronic apparatus of claim 9, wherein the clock signal is to not be received at the first logic block when the clock gate is in the disabled state.

11. The electronic apparatus of claim 9, wherein the first logic block is to perform a specific function in response to receiving the clock signal.

12. The electronic apparatus of claim 8, comprising a memory to store information regarding enabling or disabling of the clock gate based on a plurality of different frequencies.

13. The electronic apparatus of claim 8, wherein the first logic to determine an amount of bandwidth, and to determine the specific frequency based at least in part on the determined amount of bandwidth.

14. The electronic apparatus of claim 8, wherein the first logic to determine a new frequency and to change the state of the clock gate based on the determined new frequency.

15. A non-transitory machine-readable medium comprising one or more instructions that when executed cause a controller to perform one or more operations to:
  determine a specific frequency of a clock signal;
  control a clock gate to be in an enabled state when the determined specific frequency is a first frequency; and
  control the clock gate to be in a disabled state when the determined specific frequency is a second frequency different than the first frequency.

16. The machine-readable medium of claim 15, wherein a first logic block is to receive the clock signal when the clock gate is in the enabled state.

17. The machine-readable medium of claim 16, wherein the clock signal is to not be received at the first logic block when the clock gate is in the disabled state.

18. The machine-readable medium of claim 16, wherein the first logic block is to perform a specific function in response to receiving the clock signal.

19. The machine-readable medium of claim 15, wherein the one or more operations to include to determine an amount of bandwidth, and to determine the specific frequency based at least in part on the determined amount of bandwidth.

20. The machine-readable medium of claim 15, wherein the one or more operations to include to determine a new frequency and to change the state of the clock gate based on the determined new frequency.

21. An electronic apparatus comprising:
  a clock device to provide a clock signal;
  a clock gate to receive the clock signal, the clock gate to be selectively provided in an enabled state or a disabled state;
  a controller to determine a specific frequency of the clock signal, to control the clock gate to be in the enabled state or the disabled state based on the determined specific frequency, wherein the controller to determine an amount of bandwidth, and to determine the specific frequency based at least in part on the determined amount of bandwidth.

* * * * *